United States Patent
Linliu et al.

[11] Patent Number: 6,110,837
[45] Date of Patent: Aug. 29, 2000

[54] METHOD FOR FORMING A HARD MASK OF HALF CRITICAL DIMENSION

[75] Inventors: Kung Linliu; Bor-Wen Chan, both of Hsinchu, Taiwan

[73] Assignee: Worldwide Semiconductor Manufacturing Corp., Hsinchu, Taiwan

[21] Appl. No.: 09/301,481

[22] Filed: Apr. 28, 1999

[51] Int. Cl.⁷ .................................. H01L 21/00
[52] U.S. Cl. .................. 438/723; 423/734; 423/738; 423/743; 423/717
[58] Field of Search .................... 438/717, 720, 438/723, 725, 734, 736, 738, 743, 753, 756; 216/41, 47, 49, 51, 79, 99

[56] References Cited

U.S. PATENT DOCUMENTS

| | | | |
|---|---|---|---|
| 5,296,410 | 3/1994 | Yang | 438/736 X |
| 5,776,836 | 7/1998 | Sandhu | 438/717 |
| 5,902,133 | 5/1999 | Linliu | 438/717 |
| 5,916,821 | 6/1999 | Kerber | 438/717 X |
| 5,965,461 | 10/1999 | Yang et al. | 438/717 |
| 6,020,269 | 2/2000 | Wang et al. | 438/717 |

*Primary Examiner*—William Powell

[57] ABSTRACT

The present invention discloses a method for forming hard mask of half critical dimension on a substrate. A substrate is provided for the base of integrated circuits. A silicon oxide layer is formed on the substrate. A photoresist layer is formed on the silicon oxide layer and it is has a critical dimension, which the conventional lithography process can make. Subsequently, a hard mask of half critical dimension is formed in the silicon oxide layer by using the photoresist layer as an etching mask. After the oxide hard mask is formed, the gate structure of half critical dimension is formed by using the oxide hard mask.

16 Claims, 7 Drawing Sheets

METHOD FOR FORMING A HARD MASK OF HALF CRITICAL DIMENSION

FIELD OF THE INVENTION

The present invention relates to a method for forming integrated circuits using a hard mask of half critical dimension, more particularly, to a method for forming a hard mask of half critical dimension.

BACKGROUND OF THE INVENTION

In the manufacture of integrated circuits, photolithography process is an important stage. The line width of integrated circuits is smaller than half micron meter according to the technology development in recent years. The fine patterns of integrated circuits are formed by transferring patterns on reticles onto semiconductor substrates in photolithography processes. However, the patterns, which can be formed by using a specified photolithography process, have linewidths not less than a critical dimension of the process. Besides, the critical dimension of a photolithography process generated by conventional lithography equipment is hard to change.

The integrated circuits with small critical dimensions has higher integrity and operation speed than that with larger critical dimension. Thus, it becomes a trend to diminish the critical dimension of integrated circuits. As a pattern is formed on a substrate by using photolithography technology, the critical dimension of the pattern is not smaller than the critical dimension, which the photolithography process can defined. The limitation of the critical dimension is about 0.13 $\mu$m (line=space=0.13 $\mu$m) for the present lithography of 248 nm DUV stepper or scanner. The present 248 nm DUV stepper or scanner can not easily solve the line and space less than 0.13 $\mu$m, especially for the mass production. The small critical dimension such less than 0.1 $\mu$m is unlikely to perform.

In the conventional technology for fabricating integrated circuits, several approaches tried to solve the above problem. For example, phase shift mask (PSM) adapted in photolithography processes has high resolution to define fine patterns on substrates. Another approach is to use short-wavelength light, such as X-ray light, to project small images on substrates. Nevertheless, these approaches could be performed with special lithography equipments.

Therefore, what is needed is a method for fabricating integrated circuits, which has a linewidth less than a critical dimension of photolithography technology.

SUMMARY OF THE INVENTION

The present invention discloses two preferred embodiments for fabricating a hard mask with half critical dimension.

The first embodiment of the present invention discloses a method of fabricating an oxide hard mask using polymer-like spacers. A silicon oxide layer is formed on the semiconductor substrate. A photoresist pattern of a critical dimension is defined on the silicon oxide layer. A first polymer layer is formed on sidewalls of the photoresist pattern, on a top surfaces of the photoresist pattern and on a top surface of the silicon oxide layer, wherein the first polymer layer has a thickness of half critical dimension. The first polymer layer on the top surface of the photoresist layer and the silicon oxide layer is removed. The silicon oxide layer is etched using the first polymer layer and the photoresist layer as an etching mask. The photoresist pattern is removed. A second polymer layer is formed on a surface of the first polymer layer, on the top surface of the silicon oxide layer and on the semiconductor substrate, wherein the second polymer layer has a thickness of quarter critical dimension. The second polymer layer on the top surface of the silicon oxide layer is removed. The silicon oxide layer is etched using the first polymer layer and the second polymer layer as an etching mask to form an oxide hard mask of half critical dimension on the substrate.

The second embodiment of the present invention discloses a method of fabricating hard mask of small critical dimension using silicon nitride or silicon oxide spacers. A silicon oxide layer is formed on the substrate. A polysilicon layer is formed on the silicon oxide layer. A photoresist pattern is defined on the polysilicon layer, wherein the photoresist pattern has a line width of a critical dimension. The polysilicon layer is etched by using the photoresist pattern as a hard mask to form polysilicon islands of half critical dimension on the silicon oxide layer. Spacers is formed on the sidewalls of the polysilicon islands, wherein the spacers has a thickness of half critical dimension. The polysilicon islands is removed, wherein the spacers having a line width of half critical dimension. The silicon oxide layer is etched by using the spacers as an etching mask to form an oxide mask of half critical dimension on the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Two preferred embodiments according to the present invention are disclosed, which are used for fabricating hard mask of half critical dimension.

The first embodiment of the present invention discloses a method of fabricating oxide hard mask using polymer-like spacers. A silicon oxide layer is formed on the semiconductor substrate. A photoresist pattern of a critical dimension is defined on the silicon oxide layer. A first polymer layer is formed on sidewalls of the photoresist pattern, on a top surfaces of the photoresist pattern and on a top surface of the silicon oxide layer, wherein the first polymer layer has a thickness of half critical dimension. The first polymer layer on the top surface of the photoresist layer and the silicon oxide layer is removed. The silicon oxide layer is etched using the first polymer layer and the photoresist layer as an etching mask. The photoresist pattern is removed. A second polymer layer is formed on a surface of the first polymer layer, on the top surface of the silicon oxide layer and on the semiconductor substrate, wherein the second polymer layer has a thickness of quarter critical dimension. The second polymer layer on the top surface of the silicon oxide layer is removed. The silicon oxide layer is etched using the first polymer layer and the second polymer layer as an etching mask to form an oxide hard mask of half critical dimension on the substrate.

The second embodiment of the present invention discloses a method of fabricating hard mask of small critical dimension using silicon nitride or silicon oxide spacers. A silicon oxide layer is formed on the substrate. A polysilicon layer is formed on the silicon oxide layer. A photoresist pattern is defined on the polysilicon layer, wherein the photoresist pattern has a line width of a critical dimension. The polysilicon layer is etched by using the photoresist pattern as a hard mask to form polysilicon islands of half critical dimension on the silicon oxide layer. Spacers is formed on the sidewalls of the polysilicon islands, wherein the spacers has a thickness of half critical dimension. The polysilicon islands is removed, wherein the spacers having a line width of half critical dimension. The silicon oxide layer is etched by using the spacers as an etching mask to form an oxide mask of half critical dimension on the substrate.

Figure 1:
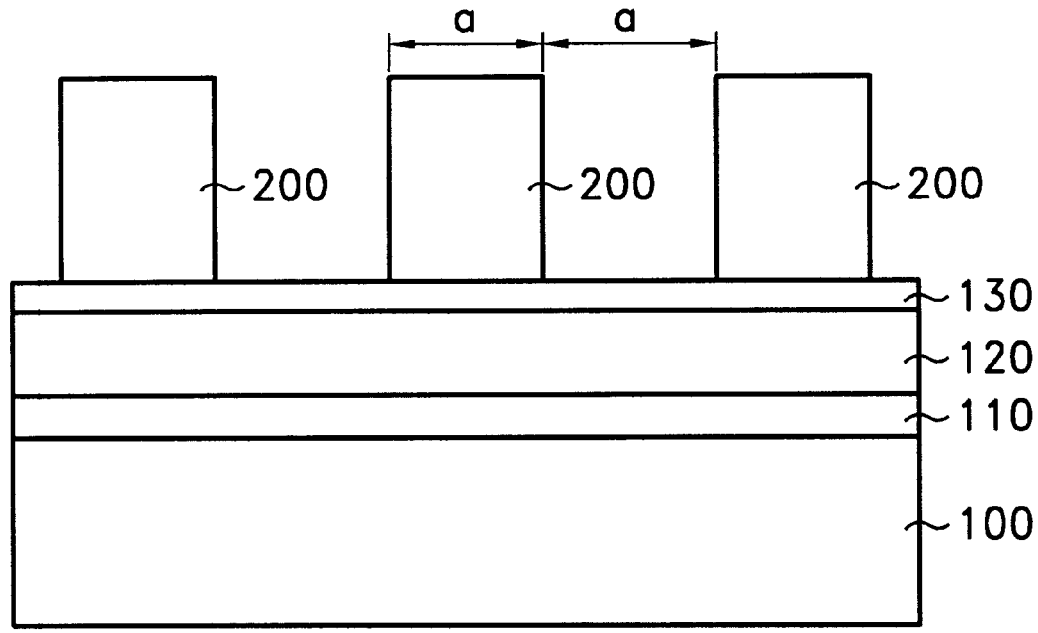
FIG. 1 shows a cross-section view of a semiconductor substrate in accordance with the first embodiment of the present invention, photoresist patterns of a critical dimension are formed on a oxide/poly/oxide stacked layer and the stack layer is formed on the substrate.

The first embodiment is described as below, in reference to FIG. 1 to FIG. 8. Referring to FIG. 1, a semiconductor substrate 100 with (100) crystal orientation is provided and it is a basis of integrated circuits. The surface of the substrate 100 is oxidized by using thermal oxidation technique to form a gate oxide layer 110. A polysilicon layer 120 is formed on the gate oxide layer 110 and it serves as polysilicon gate structure of integrated circuits. In a case, the polysilicon layer 120 has a thickness range between about 1500 to 2000 angstroms and the silicon oxide layer 130 has a thickness more than 300 angstroms. After the polysilicon layer 120 is deposited, a silicon oxide layer 130 is formed on the polysilicon layer 120. A photoresist pattern 200 is defined on the silicon oxide layer 130 by using a conventional photolithography process. The PR includes a plurality of opening having a width of a critical dimension. Assume that the opening are created by using the highest resolution of the stepper, then the width of the openings is the limitation of the photolithography technology. The limitation of the critical dimension is about 0.13 μm (line=space=0.13 μm) for the present lithography of 248 nm DUV stepper or scanner.

Figure 2:
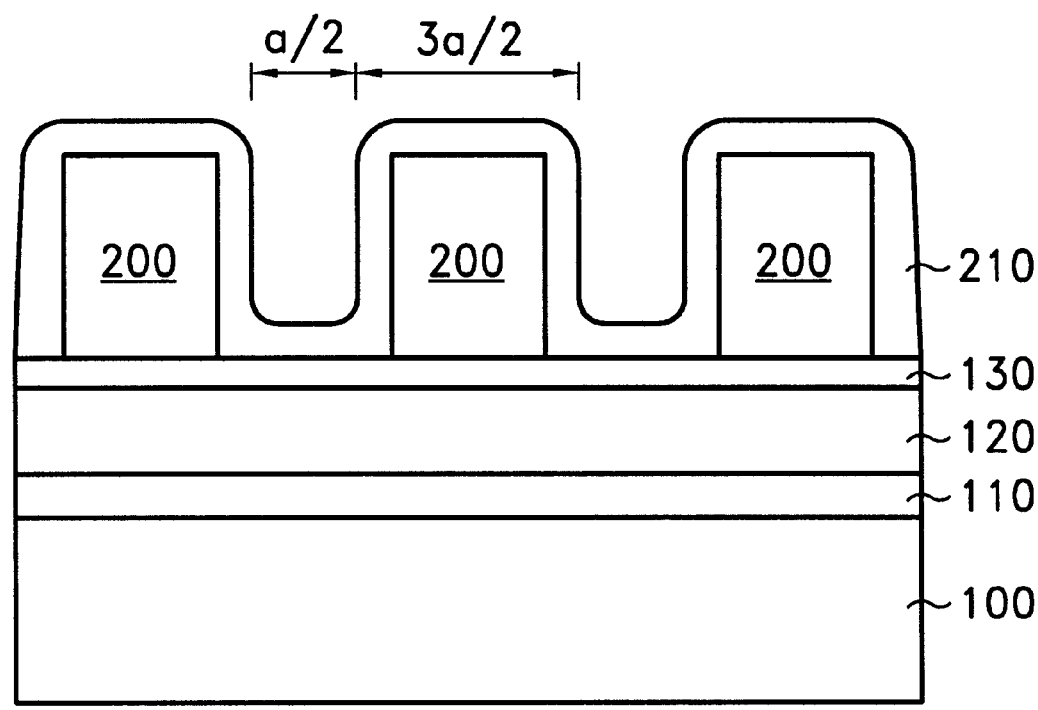
FIG. 2 shows a cross-section view of the semiconductor substrate in accordance with the first embodiment of the present invention, a first polymer layer is formed on the surface of the photoresist patterns to narrow down the space between the photoresist patterns.

Referring to FIG. 2, a polymer layer 210 is formed on the surface of the photoresist layer 200 and on the silicon oxide layer 130 between the lines of the photoresist layer 210. In a case, the polymer layer 200 is formed in an etching chamber or a deposition chamber. Furthermore, the polymer layer 210 has a thickness of half critical dimension. After the polymer layer 210 is formed, the sequeezed openings of the photoresist layer 200 is narrowed to a thickness of half critical dimension and the photoresist layer 200 having the polymer layer 210 formed thereon has a width of one and half critical dimension.

Figure 3:
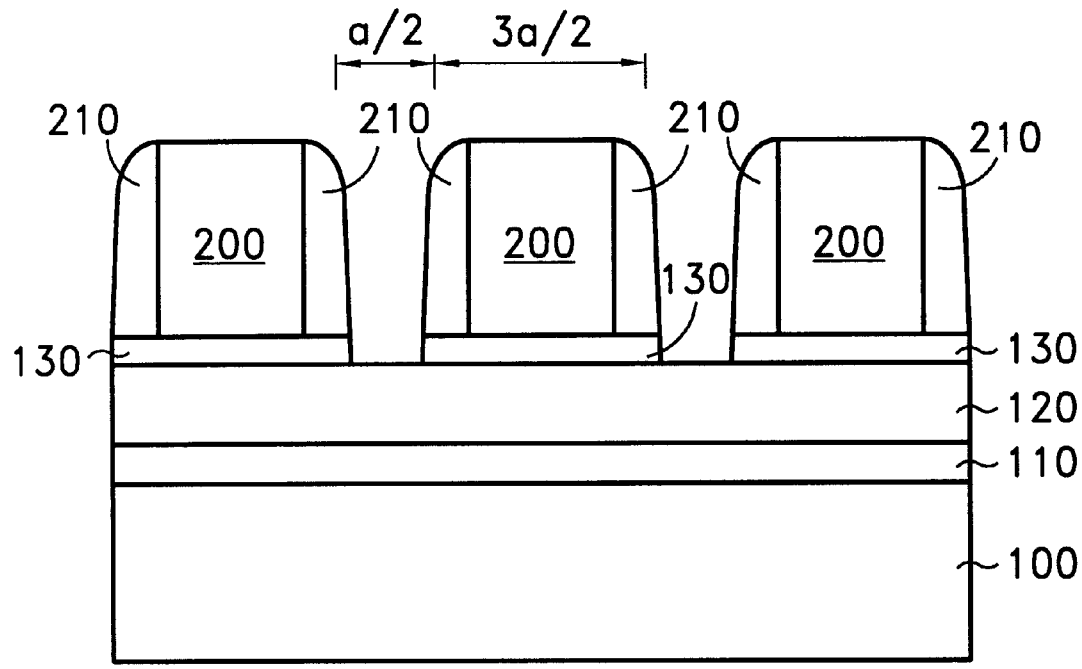
FIG. 3 shows a cross-section view of the semiconductor substrate in accordance with the first embodiment of the present invention, the first polymer layer on the top surface of the photoresist patterns and between the photoresist patterns is etched and an oxide layer is etched to form oxide patterns under the photoresist patterns.

Referring to FIG. 3, an anisotropical etching is performed to remove the polymer layer 210 on the top surface of the photoresist layer 200 and on the surface of the silicon oxide layer 130. In the etching process of the polymer layer 210, the polymer layer 210 on the sidewalls of the photoresist layer 200 is not etched. In other word, the critical dimension of the photoresist layer 200 with the polymer layer 210 is remains the dimension of (3/2)a after the anisotropical etching of the polymer layer 210. Subsequently, the silicon oxide layer 130 is etched using the photoresist layer 200 and the polymer layer 210 as an etching mask. The silicon oxide layer 130, which is not covered by the photoresist layer 200 and the polymer layer 210, is removed. The silicon oxide layer 130 after the etching has a same critical dimension with that of the photoresist layer 200 with the polymer layer 210. Thus, the openings width of the silicon oxide layer 130 is about one and half critical dimension.

Figure 4:
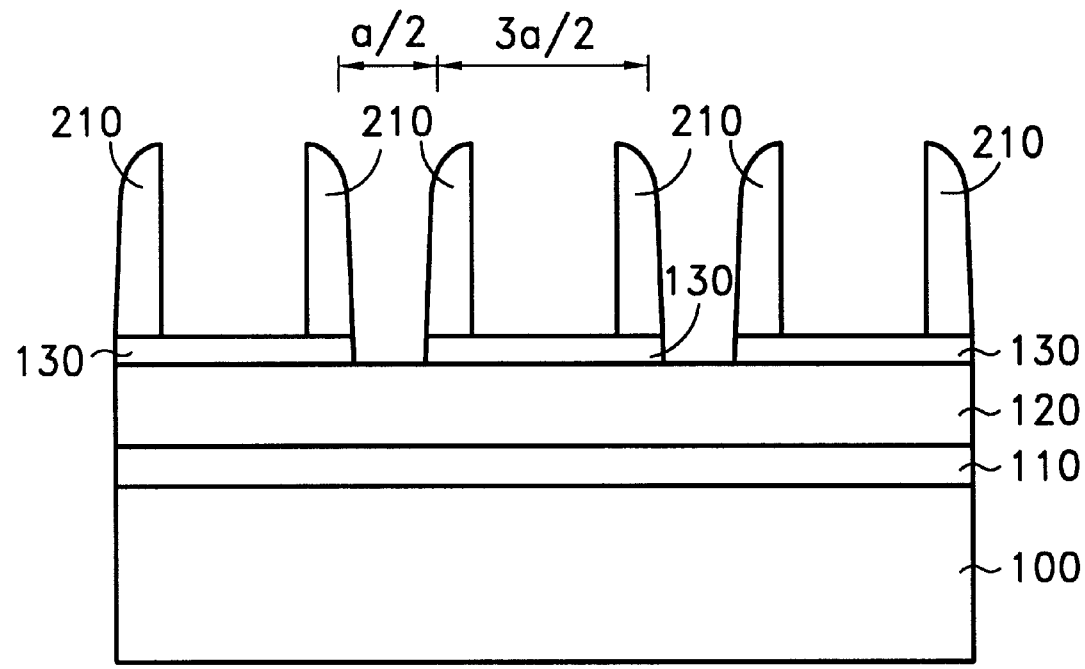
FIG. 4 shows a cross-section view of the semiconductor substrate in accordance with the first embodiment of the present invention, the photoresist patterns are removed by using a conventional technique and a photoresist cavity is formed in the first polymer layer.

Turning to FIG. 4, the photoresist layer 200 is removed by using a PR stripping technique and the polymer layer 210 has become several pairs of polymer spacer standing on the silicon oxide layer 130, thereby forming a cavity in a pair of polymer spacer. Besides, the openings of the silicon oxide layer 130 have a width of half critical dimension.

Figure 5:
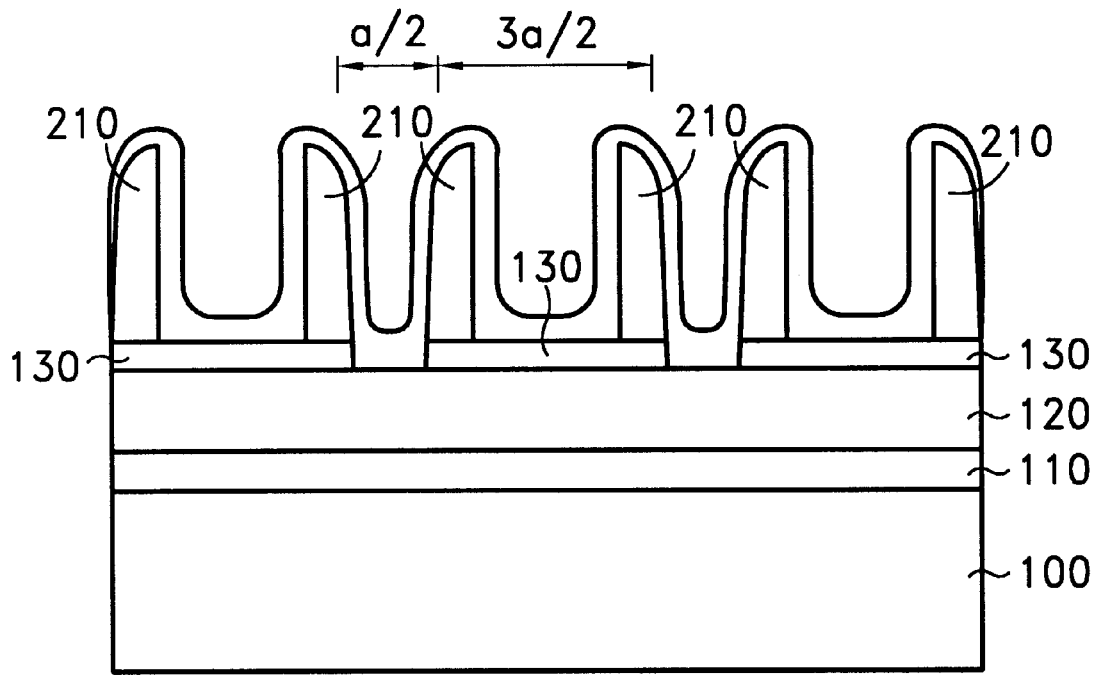
FIG. 5 shows a cross-section view of the semiconductor substrate in accordance with the first embodiment of the present invention, a second polymer layer is formed on the surface of the first polymer layer and on the top surface of the oxide layer.

Turning to FIG. 5, another polymer layer 220 is next formed on the surface of the polymer layer 210, the silicon oxide layer 130 and the polysilicon layer 120. The polymer layer 220 refills into the opening of the silicon oxide layer 130 to diminish the critical dimension of the photoresist cavity in each pair of the photoresist spacers. In a case, the polymer layer 220 is formed in an etching chamber or a deposition chamber. The polymer layer 220 has a thickness of quarter critical dimension.

Figure 6:
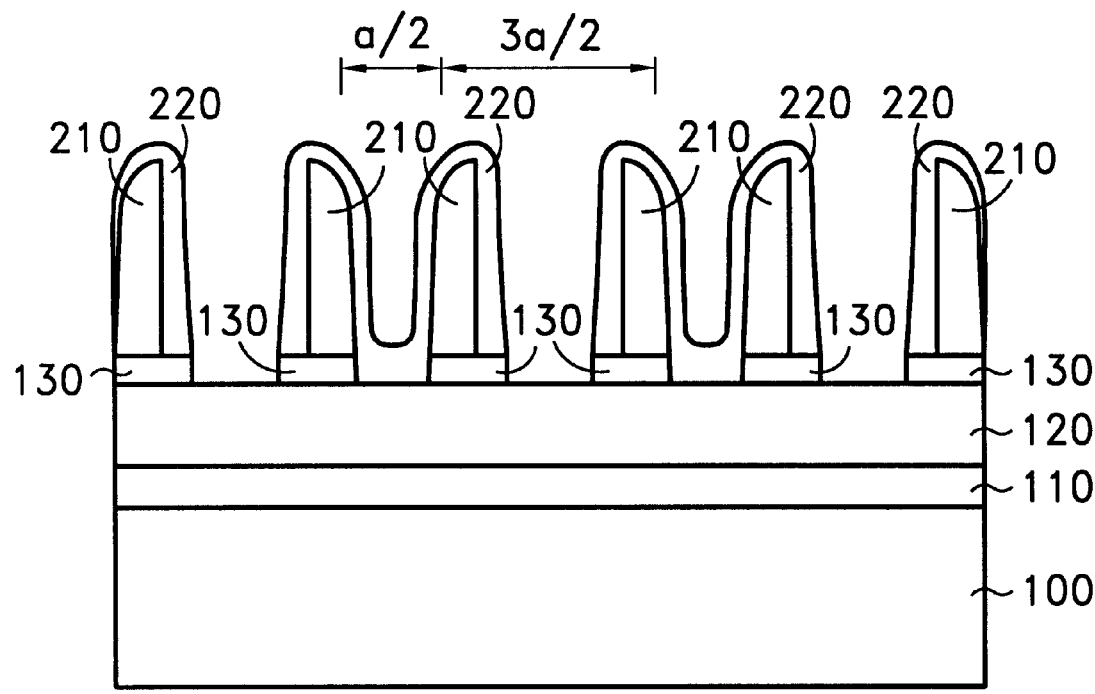
FIG. 6 shows a cross section view of the semiconductor substrate in accordance with the first embodiment of the present invention, the second polymer layer on the top surface of the oxide layer is removed and the oxide layer is then etched by using the first polymer layer and the second polymer layer as a etching mask.

Turning to FIG. 6, an etching process is performed to anisotropically etch the polymer layer 220 and the lateral portion of the polymer layer 220 on the silicon oxide layer 130 is removed. The polymer islands is consisted of the polymer layer 210 and the polymer 220 stand on the silicon oxide layer 130 and the polysilicon layer 120. The distance between two adjacent pairs of the polymer spacer, that is the polymer layer 210, is about half critical dimension. The width of a polymer island and a photoresist cavity formed therein is about one and half critical dimension. That is, the critical dimension of the polymer islands or the polymer spacers is precisely defined by controlling the thickness of the polymer layer 210 and the polymer layer 220. After the polymer islands are formed on the silicon oxide layer 130 and the polysilicon layer 120, the silicon oxide 130 is etched by using the polymer islands as an etching mask and the oxide hard mask of half critical dimension is completed.

Figure 7:
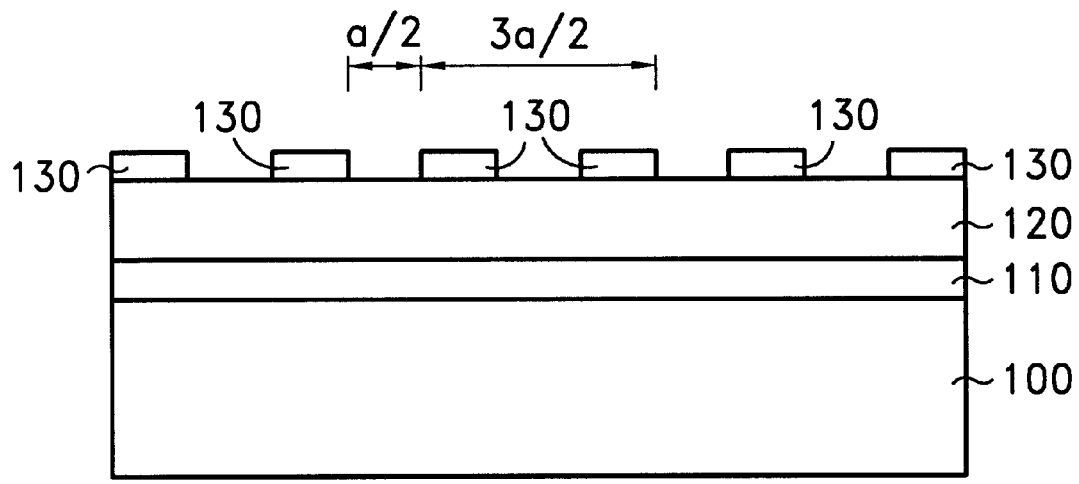
FIG. 7 shows a cross-section view of the semiconductor substrate in accordance with the first embodiment of the present invention, the first polymer layer and the second polymer layer are removed and an oxide pattern of half critical dimension is on a polysilicon layer.

Turning to FIG. 7, the polymer layer 210 and the polymer layer 220 are removed by using conventional techniques. The oxide hard mask is formed on the polysilicon layer 120. The space in the hard mask is as same as that between the polymer spacers and it is about half critical dimension. The space between two portions of the hard mask has a width about one and half critical dimension. Therefore, the width of the pattern in the hard mask must be half critical dimension.

Figure 8:
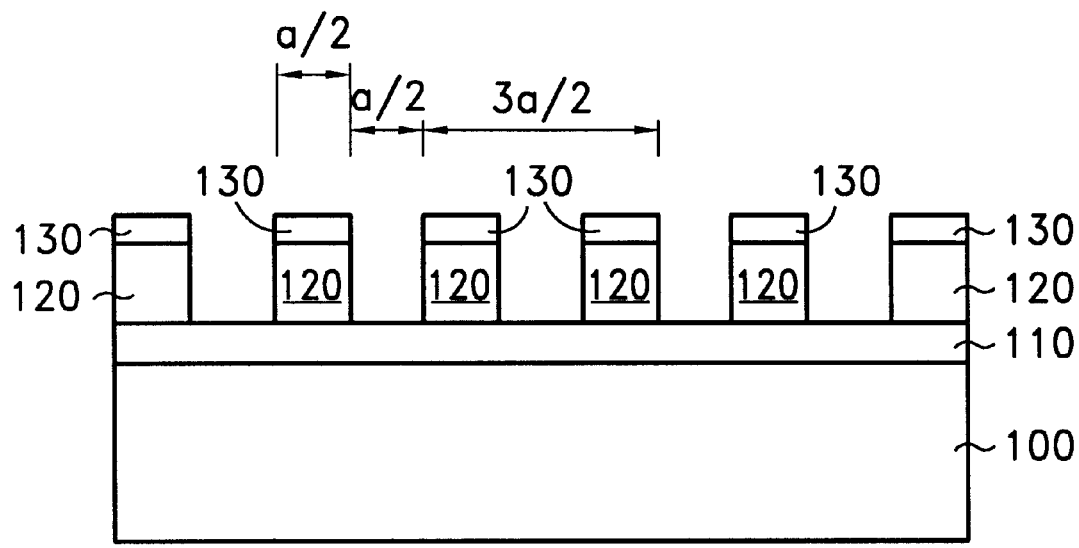
FIG. 8 shows a cross-section view of the semiconductor substrate in accordance with the first embodiment of the present invention, the polysilicon layer is etched using the oxide patterns as an etching mask.

Referring to FIG. 8, the polysilicon layer 120 is etched to form gates on the gate oxide layer 110 and the silicon oxide layer 130 serves as a hard mask of the etching process. The gates have same critical dimension as the silicon hard mask. Furthermore, the space between the gates has a width of half critical dimension.

In the following description, the second embodiment of the present invention is described in reference with FIG. 9 to FIG. 13.

Figure 9:
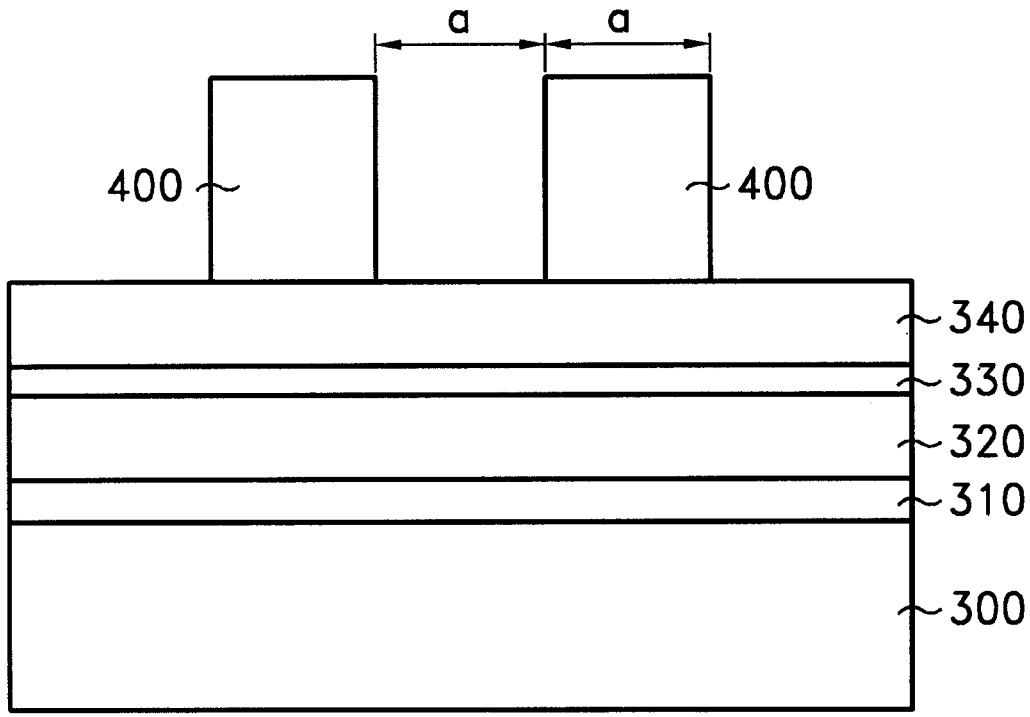
FIG. 9 shows a cross-section view of the semiconductor substrate in accordance with the second embodiment of the present invention, a photoresist pattern of a critical dimension is formed on a polysilicon layer.

Referring to FIG. 9, a substrate 300 with (100) crystal orientation is provided and integrated circuits are formed thereon. A gate oxide layer 310 is formed on the substrate 300. A polysilicon layer 320 is formed on the gate oxide layer 310 and it serves as gates of integrated circuits. In a case, the thickness of the polysilicon layer 320 ranges from 1500 to 2000 angstroms. A silicon oxide layer 330 is formed on the polysilicon layer 320 and a hard mask of half critical dimension is fabricated in the silicon oxide layer 330. In a preferred embodiment, the silicon oxide layer 330 has a thickness more than 300 angstroms.

Still referring to FIG. 9, a polysilicon layer 340 is formed on the silicon oxide layer 330 and a photoresist pattern 400 is defined on the polysilicon layer 340 by using conventional photolithography techniques. The photoresist pattern 400 has space and line of a critical dimension, which is the limitation of the lithography technology. The limitation of the critical dimension, that is denoted as "a" in the drawings, is about 0.13 µm (line=space=0.13 µm) for the conventional lithography of 248 nm DUV stepper or scanner.

Figure 10:
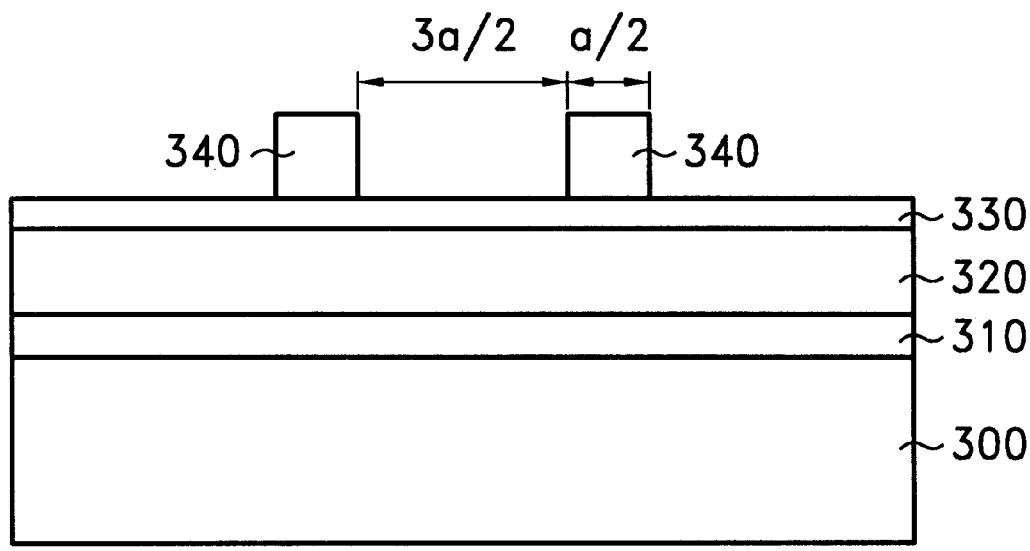
FIG. 10 shows a cross-section view of the semiconductor substrate in accordance with the second embodiment of the present invention, the polysilicon layer is etched and a polysilicon pattern having a width of half critical dimension is formed.

Turning to FIG. 10, the polysilicon layer 340 is etched by using the photoresist pattern 400 as an etching mask. After the etching process, the polysilicon layer 340 has lines of half critical dimension and the space between two lines has a width of one and half critical dimension.

Figure 11:
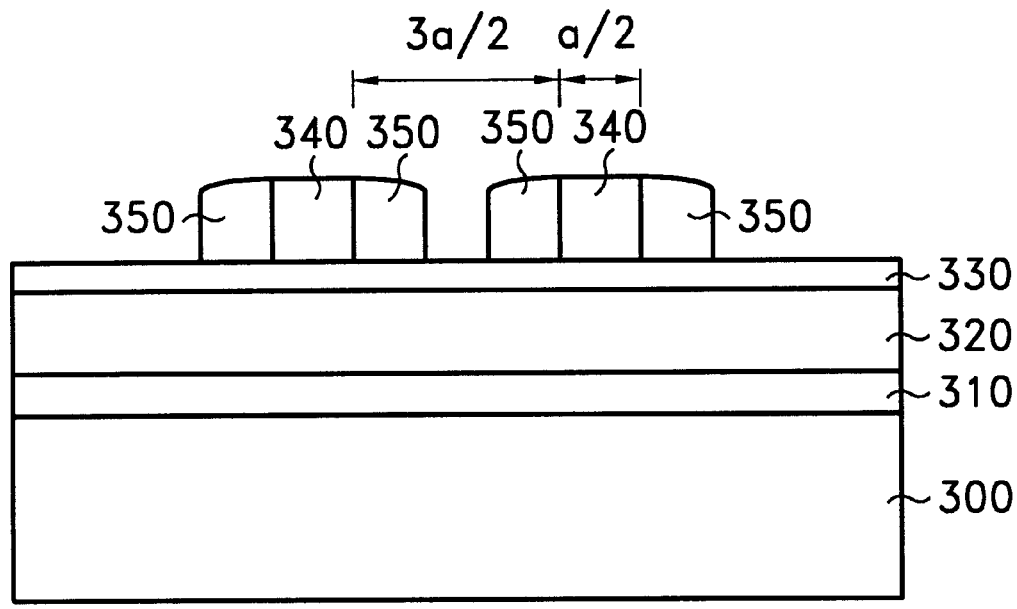
FIG. 11 shows a cross-section view of the semiconductor substrate in accordance with the second embodiment of the present invention, spacers are formed on the sidewalls of the polysilicon pattern and the spacers have a thickness of half critical dimension.

Turning to FIG. 11, a silicon oxide layer or a silicon nitride layer, which has a thickness about half critical dimension, is deposited on the sidewalls of the polysilicon layer 340 and on the silicon oxide layer 330. An etching process is then performed on the silicon oxide layer or the silicon nitride layer to form spacer 350 on the sidewall of the polysilicon layer 340.

Figure 12:
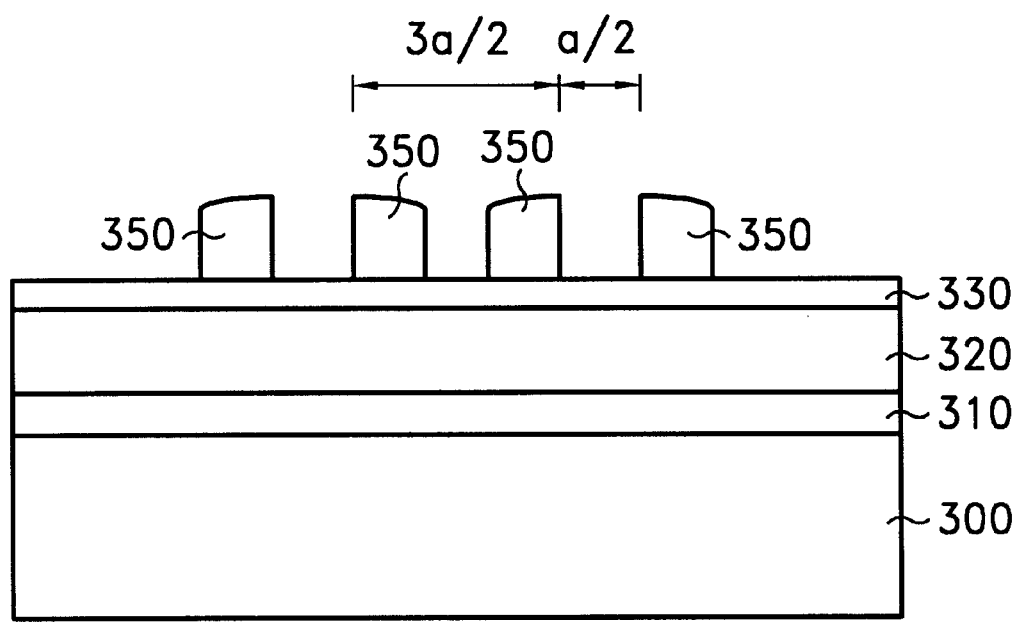
FIG. 12 shows a cross-section view of the semiconductor substrate in accordance with the second embodiment of the present invention, the polysilicon pattern between the spacers are removed and the spacers are served as a hard mask of half critical dimension.

Turning to FIG. 12, the polysilicon layer 340 is removed by using conventional etching techniques. There form several pairs of island, which are the spacers 350, standing on the silicon oxide layer 330. Moreover, the width of the islands is about half critical dimension and the space between the islands is about half critical dimension.

Figure 13:
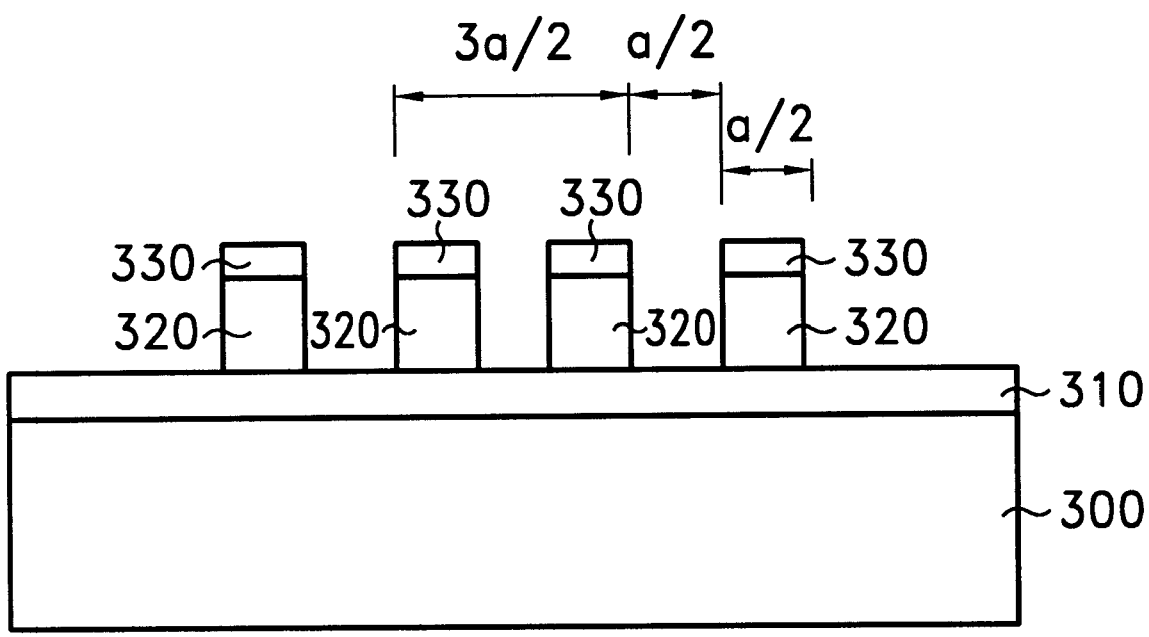
FIG. 13 shows a cross-section view of the semiconductor substrate in accordance with the second embodiment of the present invention, the oxide layer under the spacers is etched to form an oxide pattern of half critical dimension and the polysilicon layer under the oxide pattern is etched by using the oxide pattern as a hard mask.

Turning to FIG. 13, the silicon oxide layer 330 not covered by the spacer 350 is etched, an oxide hard mask of half critical dimension is formed on the polysilicon layer 320 and space in the oxide hard mask is about half critical dimension. The hard mask formed of the silicon oxide layer 330 serves as an etching mask of polysilicon gate in integrated circuits. An etching process is performed to etch the polysilicon layer 320 and gates are formed on the gate oxide layer 310. These gates have same width as that hard mask.

While the preferred embodiment of the invention has been illustrated and described, it will be appreciated that various changes can be made therein without departing from the spirit and scope of the invention.

What is claimed is:

1. A method for forming an oxide hard mask of half critical dimension on a semiconductor substrate, comprising:

forming a silicon oxide layer on said semiconductor substrate;

defining a photoresist pattern of a critical dimension on said silicon oxide layer;

forming a first polymer layer on said photoresist pattern and on said silicon oxide layer, wherein said first polymer layer has a thickness of half critical dimension;

removing said first polymer layer on a top surface of said photoresist layer and said silicon oxide layer;

etching said silicon oxide layer using said first polymer layer and said photoresist layer as an etching mask;

removing said photoresist pattern;

forming a second polymer layer on said first polymer layer, on said silicon oxide layer and on said semiconductor substrate, wherein said second polymer layer has a thickness of quarter critical dimension;

removing said second polymer layer on a top surface of said silicon oxide layer; and etching said silicon oxide layer using said first polymer layer and said second polymer layer as an etching mask to form an oxide hard mask of half critical dimension on said substrate.

2. The method according to claim 1, wherein said silicon oxide layer has a thickness more than 300 angstroms.

3. The method according to claim 1, wherein said oxide hard mask is served as an etching mask to form a gate structure of half critical dimensions on said semiconductor substrate.

4. The method according to claim 1, wherein said first polymer layer and said second polymer layer are formed in etching chambers.

5. The method according to claim 1, wherein said first polymer layer and said second polymer layer are formed in deposition chambers.

6. A method for forming an oxide hard mask of half critical dimension on a semiconductor substrate, comprising:

forming a silicon oxide layer on said semiconductor substrate;

defining a photoresist pattern of a critical dimension on said silicon oxide layer, wherein said photoresist pattern has a space of a critical dimension;

forming a first polymer layer on sidewalls of said photoresist pattern, on a top surfaces of said photoresist pattern and on a top surface of said silicon oxide layer, wherein said first polymer layer has a thickness of half critical dimension;

removing said first polymer layer on said top surface of said photoresist layer and said silicon oxide layer;

etching said silicon oxide layer using said first polymer layer and said photoresist layer as an etching mask;

removing said photoresist pattern;

forming a second polymer layer on a surface of said first polymer layer, on said top surface of said silicon oxide layer and on said semiconductor substrate, wherein said second polymer layer has a thickness of quarter critical dimension;

removing said second polymer layer on said top surface of said silicon oxide layer; and etching said silicon oxide layer by using said first polymer layer and said second polymer layer as an etching mask to form an oxide hard mask of half critical dimension on said substrate.

7. The method according to claim 6, wherein said silicon oxide layer has a thickness more than 300 angstroms.

8. The method according to claim 6, wherein said oxide hard mask is served as an etching mask to form a gate structure of half critical dimension on said semiconductor substrate.

9. The method according to claim 6, wherein said space in said photoresist layer is half critical dimension after said first polymer layer is formed on said sidewalls of said photoresist layer.

10. The method according to claim 6, wherein said first polymer layer and said second polymer layer are formed in etching chambers.

11. The method according to claim 6, wherein said first polymer layer and said second polymer layer are formed in depositing chambers.

12. A method of forming an oxide hard mask of half critical dimension on a semiconductor substrate, comprising:

forming a silicon oxide layer on said substrate;

forming a polysilicon layer on said silicon oxide layer;

defining a photoresist pattern on said polysilicon layer, wherein said photoresist pattern has a line width of a critical dimension;

etching said polysilicon layer by using said photoresist pattern as a hard mask to form polysilicon islands of half critical dimension on said silicon oxide layer;

forming spacers on sidewalls of said polysilicon islands, wherein said spacers has a thickness of half critical dimension;

removing said polysilicon islands, wherein said spacers having a line width of half critical dimension; and etching said silicon oxide layer using said spacers as an etching mask to form an oxide hard mask of half critical dimension on said substrate.

13. The method according to claim 12, wherein said spacers are formed of a material selected from a group consisting of silicon nitride and silicon oxide.

14. The method according to claim 12, wherein said oxide hard mask is served as an etching mask to form a gate structure of half critical dimension on said substrate.

15. The method according to claim 12, wherein said photoresist pattern has spaces of a critical dimension formed therein.

16. The method according to claim 12, wherein said polysilicon islands are separated from each other with spacers of a critical dimension.

* * * * *